US007589654B2

(12) United States Patent
Kim

(10) Patent No.: US 7,589,654 B2

(45) Date of Patent: Sep. 15, 2009

(54) DIGITAL-TO-ANALOG CONVERTING CIRCUIT AND APPARATUS FOR ON-DIE TERMINATION USING THE SAME

(75) Inventor: Kwan-Weon Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/026,465

(22) Filed: Feb. 5, 2008

(65) Prior Publication Data

US 2009/0058458 A1 Mar. 5, 2009

(30) Foreign Application Priority Data

Sep. 5, 2007 (KR) ..................... 10-2007-0089893

(51) Int. Cl.
*H03M 1/66* (2006.01)

(52) U.S. Cl. ....................................... 341/144; 341/142

(58) Field of Classification Search ................. 341/118, 341/120, 144, 154, 142; 326/30, 93
See application file for complete search history.

(56) References Cited

U.S. PATENT DOCUMENTS 6,958,613 B2 10/2005 Braun et al.
6,980,020 B2 12/2005 Best et al.
7,151,390 B2 12/2006 Nguyen et al.
7,170,313 B2 1/2007 Shin
7,176,711 B2 2/2007 Park et al.
7,248,192 B2 * 7/2007 Gillespie et al. ............ 341/118
7,268,712 B1 * 9/2007 Sheen ........................ 341/120
7,456,651 B2 * 11/2008 Lee ............................ 326/30
2008/0180300 A1 * 7/2008 Jeong et al. ................. 341/166

FOREIGN PATENT DOCUMENTS

JP 2005-285125 10/2005
JP 2006-129423 5/2006
KR 10-1990-0015148 10/1990
KR 10-2004-0083814 10/2004
KR 10-2005-0104236 11/2005

* cited by examiner

*Primary Examiner*—Brian Young
(74) *Attorney, Agent, or Firm*—Baker & McKenzie LLP

(57) ABSTRACT

A digital-to-analogue converting circuit includes a driver leg having a plurality of resistance elements between a power supply voltage terminal and a ground voltage terminal, wherein at least one of the plurality of resistance elements is a variable resistor, and a code level changing unit for outputting a level-changed code to a control terminal of the variable resistor based on an activation of a digital code, wherein the level-changed code is produced by converting a level of the digital code.

20 Claims, 6 Drawing Sheets

DIGITAL-TO-ANALOG CONVERTING CIRCUIT AND APPARATUS FOR ON-DIE TERMINATION USING THE SAME

CROSS-REFERENCES TO RELATED APPLICATION

The present application claims priority under 35 U.S.C. 119(a) to Korean application number 10-2007-89893, filed on Sep. 5, 2007, in the Korean Patent Office, the contents of which are incorporated by reference in their entirety as if set forth in full.

BACKGROUND

I. Technical Field

The embodiments described herein relate to semiconductor design technology and, more particularly, to a digital-to-analog converter and an apparatus for on-die termination using the same.

II. Related Art

A conventional digital-to-analog converter can be classified into two types, a first type which converts PCODE (a kind of digital code) into an analog voltage signal and a second type which converts two kinds of digital codes PCODE and NCODE into an analog voltage signal.

As shown in FIG. 1, the first type of digital-to-analog converter includes a plurality of circuit sets, each of which has a NAND gate (ND10), and a driver leg 10 to be connected to external resistor (ZQ). When an enable signal "EN" is activated to a high level, a digital code PCODE<i> (i=0 to N) is input to a gate of the transistor (M10) in the driver leg 10. When the digital code PCODE<i> is activated to a low level, the corresponding driver leg 10 is selected.

An analog voltage signal "Vpcode" is output by dividing a power supply voltage (VDDQ) in proportion to the voltage division ratio which is conducted by resistance elements consisting of the resistor (R10) and the fully turned-on transistor (M10) in the driver leg 10 and the external resistor (ZQ).

As shown in FIG. 2, the second type of digital-to-analog converter includes a plurality of circuit sets, each of which has a NAND gate (ND20) and a driver leg 20.

When an enable signal "EN" is activated to a high level, the digital code PCODE<i> is input to a gate of the transistor (M20) in the driver leg 20. The digital code NCODE<i> is input to a gate of the transistor (M21) in the driver leg 20 regardless of the enable signal "EN."

When the digital codes PCODE<i> and NCODE<i> are respectively activated to low and high levels, an analogue voltage signal (Vpcode) is output by dividing a power supply voltage (VDDQ) in a proportion to the voltage division ratio which is conducted by resistance elements consisting of resistors (R20) and (R21) and the fully turned-on transistors (M20) and (M21) in the driver leg 10.

In an on-die termination apparatus, the configuration shown in FIG. 2 can be used for calibrating another digital code NCODE based on the calibrated digital code PCODE of the calibration that is executed in the digital-to-analog converter.

However, according to the conventional on-die termination apparatus, since digital codes PCODE<i> and NCODE<i> are in a voltage level of the power supply voltage or a ground voltage level, the transistors (M10), (M20) and (M21) in the driver legs 10 and 20 cannot be finely controlled. These transistors are controlled only in full turn-on/off operations. The resistance can be disregarded when transistors (M10), (M20) and (M21) are fully turned on. Accordingly, since the resistance values in driver legs 10 and 20 are determined only by the passive elements (resistors (R10), (R20) and (R21)), it is not possible to finely control the resistance values and the resistance values are limited to a narrow adjustment range. Furthermore, since the resistance values in the driver legs 10 and 20 are limited to a narrow adjustment range, the number of driver legs 10 and 20 is increased in order to enlarge the adjustment range of the resistance values and the increased number of the driver legs causes an increase in the chip area of the semiconductor device.

SUMMARY

A digital-to-analogue (D/A) converter and an apparatus for on-die termination, using the same, capable of finely controlling resistance values without increasing of the number of driver legs, and enlarging an adjustment range of the resistance values are disclosed herein.

According to one aspect, a digital-to-analog converting circuit that can include a driver leg having a plurality of resistance elements between a power supply voltage terminal and a ground voltage terminal, wherein at least one of the plurality of resistance elements can be a variable resistor; and a code level changing unit that can be configured to output a level-changed code to a control terminal of the variable resistor based on an activation of a digital code, wherein the level-changed code can be produced by converting a level of the digital code is disclosed.

According to another aspect, a digital-to-analog converting circuit that can include a driver leg having a plurality of resistance elements between a power supply voltage terminal and a ground voltage terminal, wherein two of the plurality of resistance elements can be variable resistors; a first code level changing unit that can be configured to output a first level-changed code of a first variable voltage to a control terminal of one of the two variable resistors based on an activation of a first digital code, wherein the first level-changed code can be produced by converting a level of the first digital code; and a second code level changing unit that can be configured to output a second level-changed code of a second variable voltage to a control terminal of the other of the two variable resistors based on an activation of a second digital code, wherein the second level-changed code can be produced by converting a level of the second digital code is disclosed.

According to still another aspect, an apparatus for on-die termination can include a D/A converting unit that can be configured to change a resistance value of an internal circuit based on a level changing signal to have a variable voltage level in response to a digital code and output analog voltage by dividing a power supply voltage through the internal circuit; a comparison unit that can be configured to compare a reference voltage with an analog signal output from the D/A converting unit and output a comparison signal; and a counter that can be configured to up- and down-count the digital code based on the comparison signal is disclosed.

The embodiments described above can enlarge an adjustment range of a resistance value of a driver leg to more than a predetermined range of a conventional digital code but also finely control the resistance value.

Also, since the adjustment range of the resistance value can be enlarged, an on-die termination apparatus can have various on-die termination resistance values using a small number of driver legs.

These and other features, aspects, and embodiments are described below in the section entitled "Detailed Description."

BRIEF DESCRIPTION OF THE DRAWINGS

Aspects, features and embodiments are described in conjunction with the accompanying drawings, in which.

DETAILED DESCRIPTION

Figure 3:
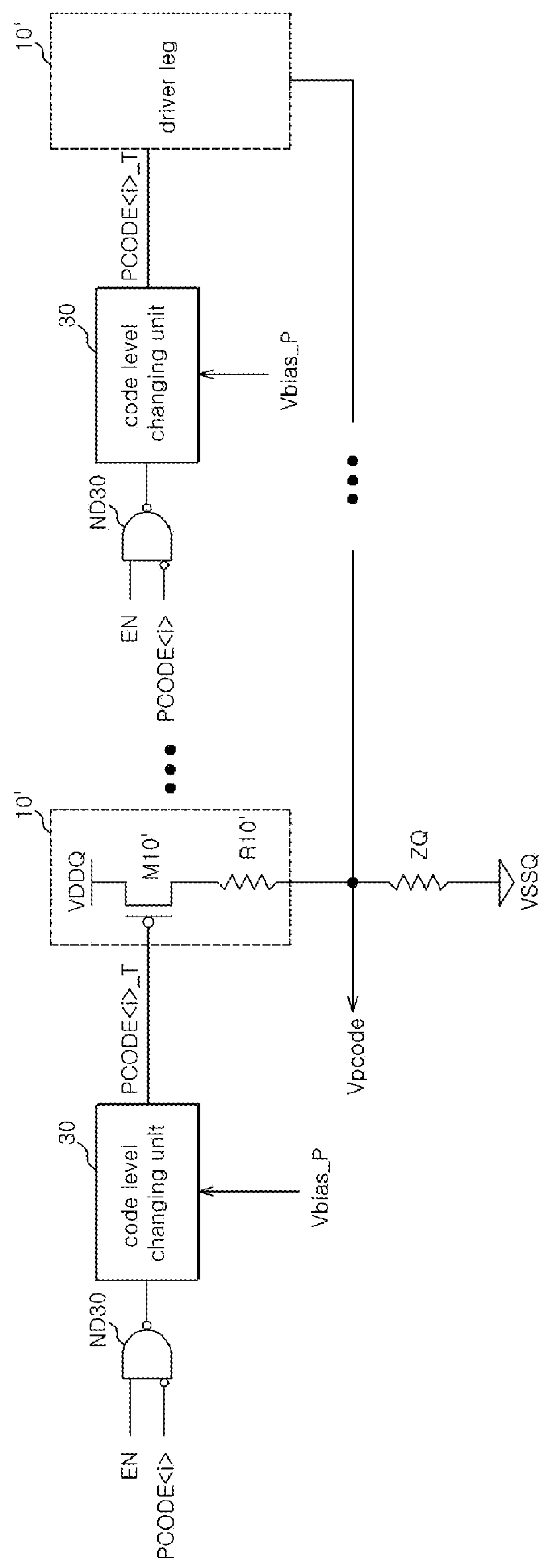
FIG. 3 is a circuit diagram illustrating a D/A converter, in accordance with one embodiment.

As shown in FIG. 3, a D/A converter can include a plurality of circuit sets, each of which can have a NAND gate (ND30), a code level changing unit 30 and a driver leg 10'.

The NAND gate ND30 can be configured to transfer a first digital code PCODE<i> in response to an enable signal "EN." Therefore, other logic devices can be substituted for the NAND gate (ND30) based on the logic level of the enable signal "EN."

Figure 1:
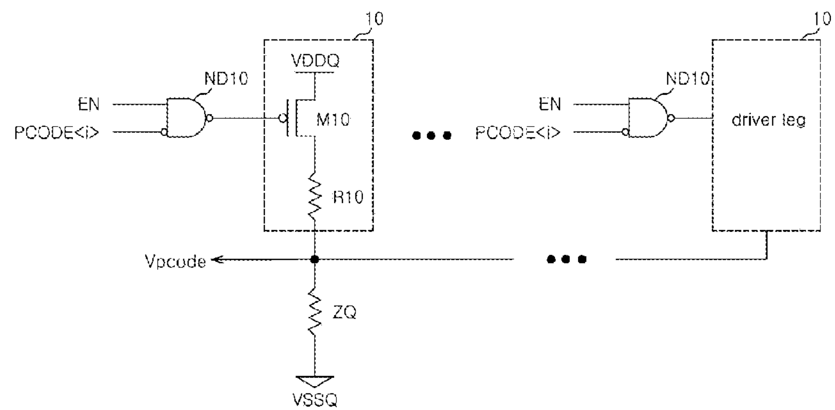
FIG. 1 is a circuit diagram illustrating a conventional D/A converter.

The driver leg 10' can have the same configuration as that mentioned in FIG. 1. However, a transistor (M10') in the driver leg 10' can be configured to not be fully turned on/off, therefore, differentiating it from the transistors described in FIG. 1. That is, the transistor (M10') in the present invention can be a variable resistor.

Figure 4:
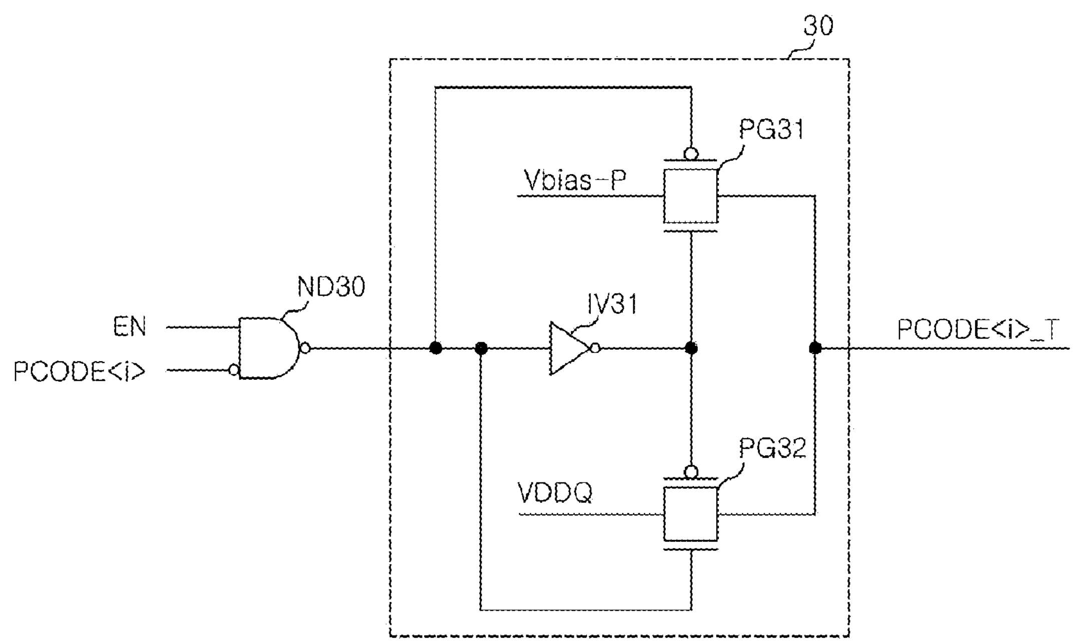
FIG. 4 is a circuit diagram illustrating a code level changing unit of FIG. 3, in accordance with one embodiment.

Referring to FIG. 4, the code level changing unit 30 can include an inverter (IV31), a first pass gate (PG31) and a second pass gate (PG32). The first pass gate (PG31) can be configured to receive the first digital code PCODE<i>. A first variable voltage (Vbias_P) can be applied to an input terminal of the first pass gate (PG31) and the first digital code PCODE<i> can be applied to a first control terminal of the first pass gate (PG31). An output of the inverter (IV31) can be applied to a second control terminal of the first pass gate (PG31). A power supply voltage (VDDQ) can be applied to an input terminal of the second pass gate (PG32) and the output of the inverter (IV31) can be applied to a first control terminal of the second pass gate (PG32). The first digital code PCODE<i> can be applied to a second control terminal of the second pass gate (PG32). An output terminal of the first pass gate (PG31) can be commonly connected to an output terminal of the second pass gate (PG32).

The operation of the D/A converter, according one embodiment, will be described in detail below.

When the enable signal "EN" is inactivated to a low level, a high level signal can be input into the code level changing unit 30 regardless of the logic level of the first digital code PCODE<i>. On the contrary, when the enable signal "EN" is activated to a high level, the first digital code PCODE<i> can be transferred to the code level changing unit 30. The transferred signal can be one of the first digital code signals "PCODE<0:N>" and the number of the bits of the first digital code PCODE<i> can be determined by the number of the driver legs.

The code level changing unit 30 of FIG. 4 can be configured to output the power supply voltage (VDDQ) as a first level-changed code PCODE<i>_T when the first digital code PCODE<i> is activated to a high level.

The first level-changed code PCODE<i>_T can be input into the transistor (M10') in the driver leg 10'.

The transistor (M10') in the driver leg 10' can be fully turned off because the gate voltage level is correspondent to the power supply voltage (VDDQ). That is, the driver leg 10' which receives the inactivated digital code PCODE<i> does not perform the D/A conversion.

On the other hand, the code level changing unit 30 of FIG. 4 can be configured to convert the first variable voltage (Vbias_P) into the first level-changed code PCODE<i>_T when the first digital code PCODE<i> is activated to a low level. The first level-changed code PCODE<i>_T can be input into the transistor (M10') in the driver leg 10'.

The first variable voltage (Vbias_P) can be selectively varied in a range of a turn-on starting voltage level to a full turn-on voltage level of the transistor (M10'), i.e., VDDQ–Vtp (threshold voltage of PMOS) to 0V. The first variable voltage (Vbias_P) can be produced by a voltage generator which can be provided within a D/A converting circuit or from the outside (a semiconductor memory chip having a D/A converting circuit or an individual memory controller to control the semiconductor memory chip). Such a voltage generator can be configured to produce the first variable voltage (Vbias_P) according to a test mode signal or a mode register set signal.

The resistance value of the transistor (M10') in the driver leg 10' can be adjusted based on the voltage level of the first variable voltage (Vbias_P). The resistance of the transistor (M10') can be varied according to the voltage level of the first variable voltage (Vbias_P), being different from the conventional D/A converter in which the resistance of the transistor can be disregarded due to the full turn-on voltage or the full turn-off voltage to have an infinite quantity of resistance.

The driver leg 10', which can be selected by the first level-changed code PCODE<i>_T, can be configured to output a first analog voltage (Vpcode) by dividing the power supply voltage (VDDQ) based on the proportion of the resistance values of the transistor (M10') to function as a variable transistor, the resistor (R10') and the external resistor (ZQ).

Figure 5:
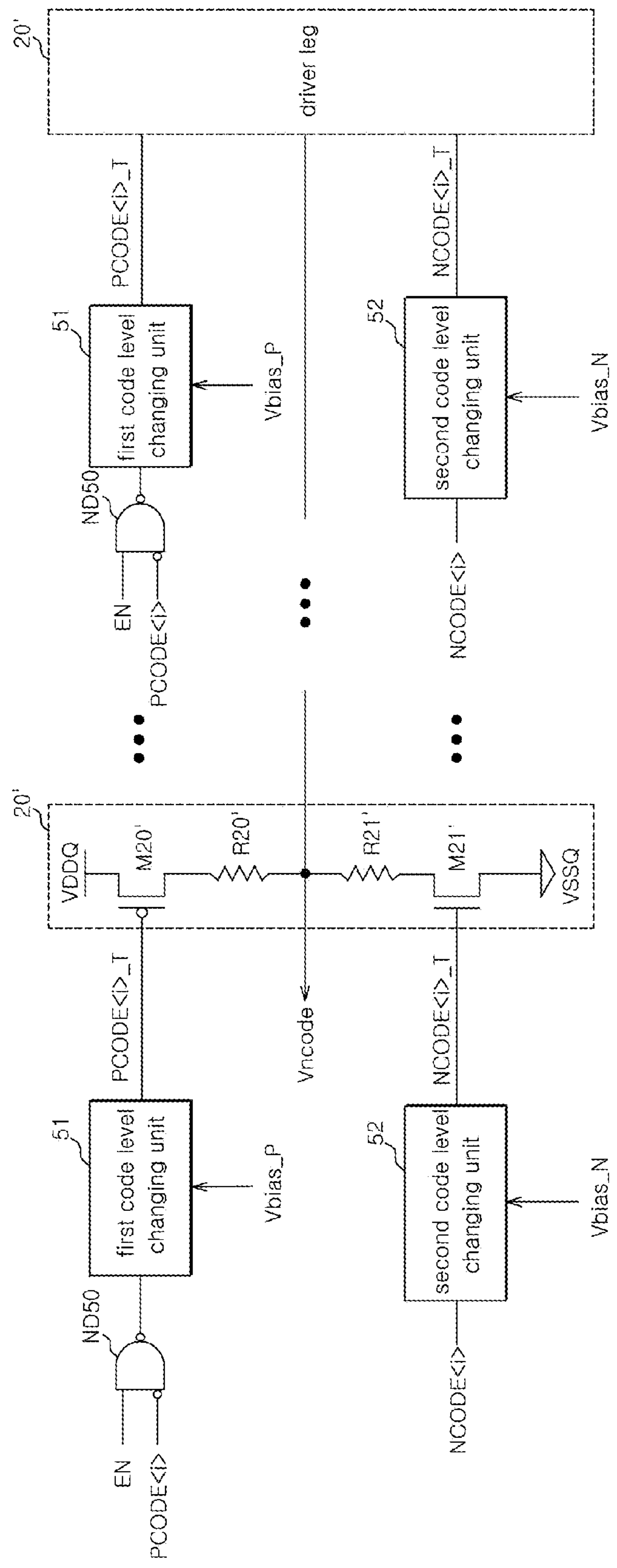
FIG. 5 is a circuit diagram illustrating a D/A converter, in accordance with one embodiment.

As shown in FIG. 5, a D/A converter can include a plurality of circuit sets, each of which can have a NAND gate (ND50), a first code level changing unit 51, a second code level changing unit 52 and a driver leg 20'.

The NAND gate (ND50) can be configured to transfer a first digital code PCODE<i> in response to an enable signal "EN." Therefore, other logic devices can be substituted for the NAND gate (ND50) based on the logic level of the enable signal "EN."

Figure 2:
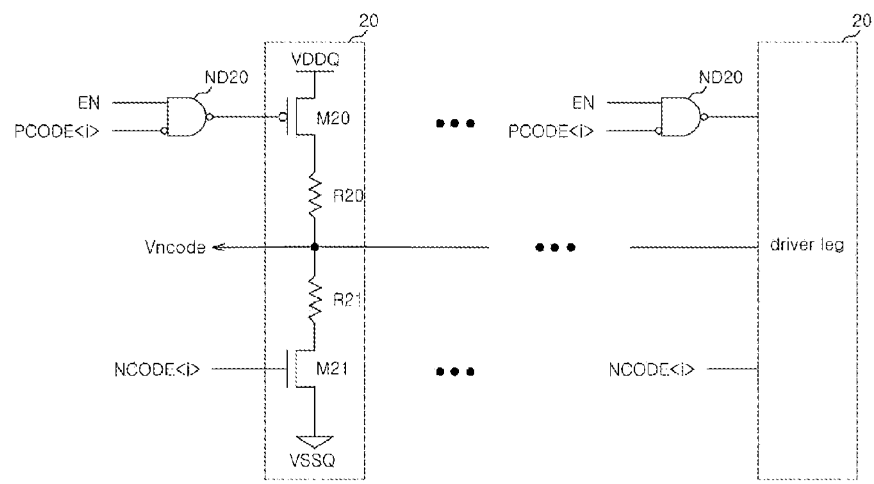
FIG. 2 is a circuit diagram illustrating another conventional D/A converter

The driver leg 20' can have the same configuration as that mentioned in FIG. 2. However, transistors (M20') and (M21') in the driver leg 20' are not fully turned on/off, therefore differentiating it from the transistors described in FIG. 2. That is, the transistors (M20') and (M21') can be variable resistors.

Figure 6:
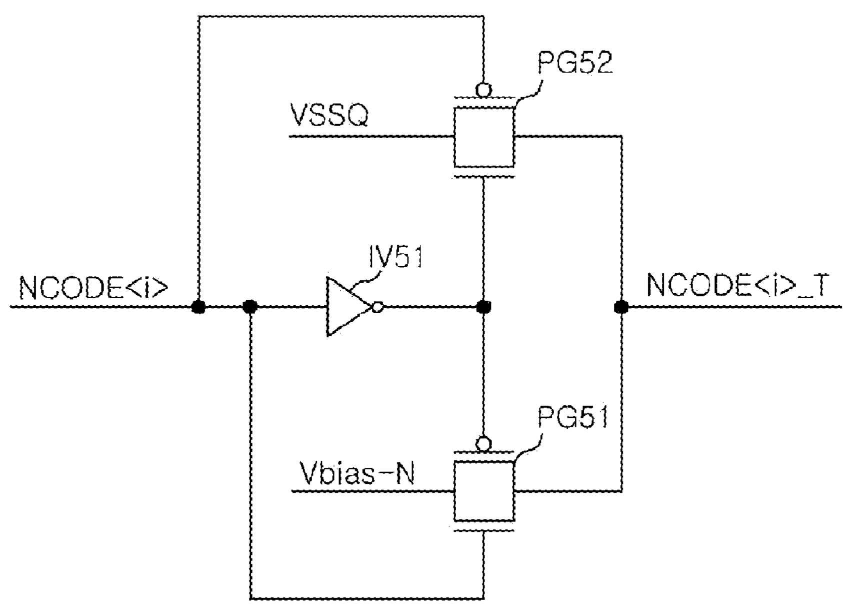
FIG. 6 is a circuit diagram illustrating a second code level changing unit of FIG. 5, in accordance with one embodiment.

The first code level changing unit 51 can have the same configuration as the code level changing unit in FIG. 4. The second code level changing unit 52, as shown in FIG. 6, can include an inverter (IV51), a first pass gate (PG51) and a second pass gate (PG52).

The inverter (IV51) can be configured to receive the second digital code NCODE<i>. A first pass gate (PG51) can be configured to receive a second variable voltage (Vbias_N). That is, the second variable voltage (Vbias_N) can be applied to an input terminal of the first pass gate (PG51), an output of the inverter (IV51) can be applied to a first control terminal of the first pass gate (PG51), and the second digital code NCODE<i> can be applied to a second control terminal of the first pass gate (PG51). A ground voltage (VSSQ) can be applied to an input terminal of the second pass gate (PG52) and the second digital code NCODE<i> can be applied to a first control terminal of the first pass gate (PG52). The output of the inverter (IV51) can be applied to a second control terminal of the second pass gate (PG52). An output terminal of the first pass gate (PG51) can be commonly connected to an output terminal of the second pass gate (PG52).

The operation of the D/A converter in accordance with another embodiment will be described in detail below.

When an enable signal "EN" is inactivated to a low level, a high level signal can be input into the first code level changing unit 51 regardless of the logic level of the first digital code PCODE<i>. On the contrary, when the enable signal "EN" is activated to a high level, the first digital code PCODE<i> can be transferred to the first code level changing unit 51.

The first code level changing unit 51 can be configured to perform the same operation as the code level changing unit 30 of FIG. 3. That is, when the first digital code PCODE<i> is inactivated, a first level-changed code PCODE<i>_T can be output in a voltage level of the power supply voltage (VDDQ). When the first digital code PCODE<i> is activated, the first level-changed code PCODE<i>_T can be output in a voltage level of a first variable voltage (Vbias_P).

When the first level-changed code PCODE<i>_T having a voltage level of the power supply voltage (VDDQ) is output, the transistor (M20') in the driver leg 20' is fully turned off. Also, when the first level-changed code PCODE<i>_T having a voltage level of the first variable voltage (Vbias_P) is output, the transistor (M20') in the driver leg 20' is turned on to an extent which the first variable voltage (Vbias_P) has the voltage level such that the resistance value of the transistor (M20') is also adjusted.

In the second code level changing unit 52 of FIG. 6, when the second digital code NCODE<i> is inactivated to a low level, the second level-changed code NCODE<i>_T can be output in a voltage level of the ground voltage (VSSQ). The second level-changed code NCODE<i>_T can be input into the transistor (M21') in the driver leg 20'.

The transistor (M21') in the driver leg 20' can be fully turned off because the gate level is in the voltage level of the ground voltage (VSSQ). That is, the driver leg 20' which receives the inactivation signal of the second digital code NCODE<i> is not selected and does not carry out the D/A conversion.

On the other hand, the code level changing unit 52 of FIG. 6 can be configured to output the second variable voltage (Vbias_N) as the second level-changed code NCODE<i>_T when the second digital code NCODE<i> is activated to a high level. The second level-changed code NCODE<i>_T can be input into the transistor (M21') in the driver leg 20'.

The second variable voltage (Vbias_N) can be selectively varied in a range of a turn-on starting voltage level to a full turn-on voltage level of the transistor (M10'), i.e., Vtn (threshold voltage of NMOS) to (VDDQ). The second variable voltage (Vbias_N) can be produced by a voltage generator which can be provided within a D/A converting circuit or provided from the outside (a semiconductor memory chip having a D/A converting circuit or an individual memory controller to control the semiconductor memory chip). Such a voltage generator can be configured to produce the second variable voltage (Vbias_N) according to a test mode signal or a mode register set signal.

The resistance value of the transistor (M21') in the driver leg 20' can be adjusted based on the voltage level of the second variable voltage (Vbias_N) and the resistance value can also be adjusted. That is, the resistance of the transistor (M21') can be varied according to the voltage level of the second variable voltage (Vbias_N), being different from the conventional D/A converter in which the resistance value of the transistor can be disregarded due to the full turn-on voltage or the full turn-off voltage to have an infinite quantity of resistance.

The driver leg 20' which is selected by the first level-changed code PCODE<i>_T and the second level-changed code NCODE<i>_T can be configured to output a second analog voltage (Vncode) by dividing the power supply voltage (VDDQ) based on the proportion of resistance values of the transistors (M20') and (M21') to function as a variable transistor and the resistors (R20') and (R21').

Figure 7:
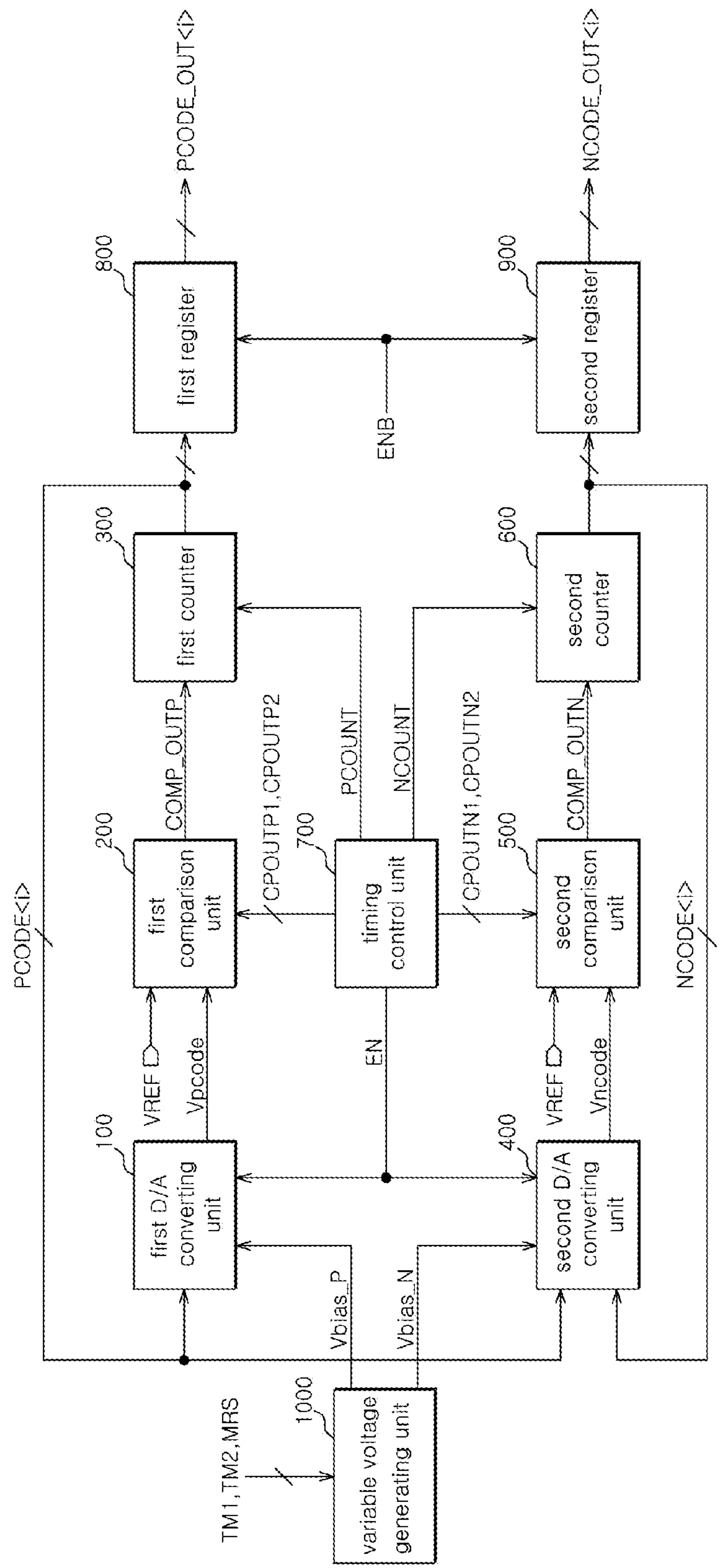
FIG. 7 is a circuit diagram illustrating an apparatus for on-die termination, in accordance with one embodiment.

An apparatus for on-die termination can use the D/A converter described above in FIGS. 3 to 6 and is shown in FIG. 7. Referring to FIG. 7, the on-die termination apparatus can include a first D/A converting unit 100, a first comparison unit 200, a first counter 300, a second D/A converting unit 400, a second comparison unit 500, a second counter 600, a timing control unit 700, a first register 800, a second register 900 and a variable voltage generating unit 1000. The first D/A converting unit 100 can have the same configuration as the D/A converting unit described in FIG. 3 and the second D/A converting unit 400 can have the same configuration as the D/A converting unit described in FIG. 5.

The first comparison unit 200 can be configured to compare the first analog voltage (Vpcode) with a reference voltage (VREF) in response to pulse signals CPOUTP1 and CPOUTP2 and output a first comparison signal "COMP_OUTP."

The second comparison unit 500 can be configured to compare the second analog voltage (Vncode) with the reference voltage (VREF) in response to pulse signals "CPOUTN1" and "CPOUTN2" and output a second comparison signal "COMP_OUTN."

The first counter 300 can be configured to perform the up and down counting operation for a value stored therein in response to a pulse signal "PCOUNT" and the first comparison signal "COMP_OUTP" and output the counting value as the first digital code PCODE<i>.

Similar to the first counter 300, the second counter 600 can be configured to perform an up and down counting operation for a value stored therein in response to a pulse signal "NCOUNT" and the second comparison signal "COMP_OUTN" and output the counting value as the second digital code NCODE<i>.

In the case of a 5-bit signal, the first and second digital codes PCODE<i> and NCODE<i> can be expressed as PCODE<0:4> and NCODE<0:4>, respectively. For convenience in illustration, the first and second digital codes are expressed as PCODE<i> and NCODE<i>, respectively.

The timing control unit 700 can be implemented by a pulse generating circuit. The timing control unit 700 can be configured to produce the pulse signals "EN," "CPOUTP1," "CPOUTP2," "CPOUTN1," "CPOUTN2," "PCOUNT" and "NCOUNT" in order to control the operation start timing of the first D/A converting unit 100, the first comparison unit 200, the first counter 300, the second D/A converting unit 400, the second comparison unit 500 and the a second counter 600.

The first register 800 can be configured to update and store the first digital code PCODE<i> which can be counted by the first counter 300 and output the stored digital code PCODE<i> to outside of the on-die termination apparatus in response to an enable bar signal "ENB." Similar to the first register 800, the second register 900 can be configured to update and store the second digital code NCODE<i> which can be counted by the second counter 600 and output the stored digital code NCODE<i> to outside of the on-die termination apparatus in response to an enable bar signal "ENB."

The variable voltage generating unit 1000 can be configured to individually control the first variable voltage (Vbias_P) and the second variable voltage (Vbias_N) based on test mode signals "TM1" and "TM2" or a mode register set signal "MRS." As shown in FIG. 7, the variable voltage generating unit 1000 can be provided to the on-die termination apparatus or one of the first and second D/A converting units 100 and 400. Furthermore, the variable voltage generating unit 1000 can be provided to all the first and second D/A converting units 100 and 400 in order that the first variable voltage (Vbias_P) and the second variable voltage (Vbias_N) can be separately produced. Also, the variable voltage generating unit 1000 can be provided to an external circuit (a system having the on-die termination apparatus, for example, a memory chip or a memory controller to control the memory chip). Here, the enable bar signal "ENB" can have a logic level opposite to the enable signal "EN" and this can be produced by inverting the enable signal "EN."

The detailed operation of the on-die termination apparatus in accordance with one embodiment will be described below.

The timing control unit 700 can be configured to produce the pulse signals "EN," "CPOUTP1," "CPOUTP2," "CPOUTN1," "CPOUTN2," "PCOUNT" and "NCOUNT" each of which can have a time difference there between. The variable voltage generating unit 1000 can be configured to individually produce the first variable voltage (Vbias_P) and the second variable voltage (Vbias_N) based on test mode signals "TM1" and "TM2" or a mode register set signal "MRS" and output them to the first and second D/A converting units 100 and 400.

When the enable signal "EN" is activated, the first D/A converting unit 100 can be configured to output the first analog signal "Vpcode" based on the first level-changed code PCODE<i>_T which can be internally converted using the first digital code PCODE<i>. The first comparison unit 200 can be configured to compare the first analog signal "Vpcode" with the reference voltage (VREF) in response to the pulse signal "CPOUTP1" and "CPOUTP2" and then output the first comparison signal "COMP_OUTP." The first digital code (PCODE<i>) which can be counted by the first counter 300 in response to the first comparison signal "COMP_OUTP" can be fed back to the first D/A converting unit 100 and the first digital code (PCODE<i>) can be repeatedly calibrated by this feedback loop.

When the enable signal "EN" is activated, the second D/A converting unit 400 can be configured to output the second analog signal "Vncode" based on the first and second level-changed codes PCODE<i>_T and NCODE<i>_T which are internally and respectively converted using the first and second digital codes PCODE<i> and NCODE<i>.

The second comparison unit 500 can be configured to compare the second analog signal"Vncode" with the reference voltage (VREF) in response to pulse signal "CPOUTN1" and "CPOUTN2" and then output the second comparison signal "COMP_OUTN." The second digital code NCODE<i> which is counted by the second counter 600 in response to the second comparison signal "COMP_OUTN" can be fed back to the second D/A converting unit 400 and the second digital code (NCODE<i>) can be repeatedly calibrated by this feedback loop.

The on-die termination calibration can be finally completed by repeating adjustment for predetermined times of the first and second digital codes PCODE<i> and NCODE<i>) through the feedback loop. Thereafter, when the enable bar signal "ENB" is activated, the first and second registers 800 and 900 can be configured to output the finally updated digital codes PCODE_OUT<i> and NCODE_OUT<i>, respectively.

As apparent from the above, the on-die termination apparatus can enlarge the adjustment range of the analog voltage signal and make it possible to finely control the analog voltage signal, by using the D/A converter in which the transistor to select the driver leg has a variable resistance. Also, the on-die termination apparatus can minutely control the calibration code and reduce the number of the driver legs resulting in area efficiency.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A digital-to-analogue converting circuit, comprising:

a driver leg having a plurality of resistance elements between a power supply voltage terminal and a ground voltage terminal, wherein at least one of the plurality of resistance elements is a variable resistor having a varied resistance value according to a level-changed code; and a code level changing unit for outputting the level-changed code to a control terminal of the variable resistor, wherein the level-changed code is produced by converting a level of the digital code using a variable voltage based on an activation of a digital code.

2. The digital-to-analogue converting circuit of claim 1, wherein one end of the variable resistor is connected to the power supply voltage terminal and the plurality of resistance elements are connected to each other between the one end of the variable resistor and the ground voltage terminal.

3. The digital-to-analogue converting circuit of claim 1, wherein the plurality of resistance elements in the driver leg are in series connected to each other between the power supply voltage terminal and the ground voltage terminal.

4. The digital-to-analogue converting circuit of claim 1, wherein the code level changing unit includes:

a first switching element for outputting the variable voltage as the level-changed code in response to the activation of the digital code; and a second switching element for outputting a fixed voltage in response to an inactivation of the digital code.

5. The digital-to-analogue converting circuit of claim 4, wherein the fixed voltage is a power supply voltage.

6. The digital-to-analogue converting circuit of claim 4, wherein the fixed voltage is a ground voltage.

7. The digital-to-analogue converting circuit of claim 1, further comprising a variable voltage generating unit for controlling the variable voltage in response to a control signal and outputting the controlled variable voltage.

8. The digital-to-analogue converting circuit of claim 7, wherein the control signal includes a test mode signal or a mode register set signal.

9. A digital-to-analogue converting circuit comprising:

a driver leg having a plurality of resistance elements between a power supply voltage terminal and a ground voltage terminal, wherein two of the plurality of resistance elements are variable resistors;

a first code level changing unit for outputting a first level-changed code of a first variable voltage to a control terminal of one of the two variable resistors based on an activation of a first digital code, wherein the first level-changed code is produced by converting a level of the first digital code; and a second code level changing unit for outputting a second level-changed code of a second variable voltage to a control terminal of the other of the two variable resistors based on an activation of a second digital code, wherein the second level-changed code is produced by converting a level of the second digital code.

10. The digital-to-analogue converting circuit of claim 9, wherein the plurality of resistance elements in the driver leg are in series connected to each other between the power supply voltage terminal and the ground voltage terminal.

11. The digital-to-analogue converting circuit of claim 9, wherein the first code level changing unit includes:

a first switching element having an input terminal to receive the first variable voltage and a control terminal to receive the first digital code; and a second switching element having an input terminal connected to the power supply terminal, a control terminal to receive an inverted signal of the first digital code, and an output terminal connected to that of the first switching element.

12. The digital-to-analogue converting circuit of claim 9, wherein the second code level changing unit includes:

a first switching element having an input terminal to receive the second variable voltage and a control terminal to receive the second digital code; and a second switching element having an input terminal connected to the ground voltage terminal, a control terminal to receive an inverted signal of the second digital code, and an output terminal connected to the first switching element.

13. The digital-to-analogue converting circuit of claim 9, further comprising a variable voltage generating unit for controlling the first and second variable voltages in response to a plurality of control signals and outputting the controlled variable voltages.

14. The digital-to-analogue converting circuit of claim 13, wherein the plurality of the control signals include test mode signals or mode register set signals.

15. The digital-to-analogue converting circuit of claim 9, further comprising a logic circuit to output the first and second digital codes to the first and second code level changing units in response to an enable signal, respectively.

16. An apparatus for on-die termination, the apparatus comprising:

a D/A converting unit for changing a resistance value of an internal circuit based on a level changing signal generated using a variable voltage in response to a digital code and outputting analogue voltage by dividing a power supply voltage through the internal circuit;

a comparison unit for comparing a reference voltage with an analogue signal outputted from the D/A converting unit and outputting a comparison signal; and a counter for up- and down-counting the digital code based on the comparison signal.

17. The apparatus of claim 16, wherein the D/A converting unit includes:

a plurality of driver leg sets each of which has a plurality of resistance elements, wherein the plurality of resistance elements are connected between power source terminal and ground terminal, wherein at least one variable resistor is included therein;

a code level changing unit for converting the digital code into a level-changed signal using the variable voltage and outputting the level-changed signal to the variable resistance element of a selected one from the plurality of driver leg sets.

18. The apparatus of claim 17, wherein the code level changing unit includes:

a first switching element for outputting the variable voltage as the level-changed signal in response to an activation of the digital code; and a second switching element for outputting a fixed voltage in response to an inactivation of the digital code.

19. The apparatus of claim 16, further comprising a variable voltage generating unit for controlling the variable voltage in response to a control signal and outputting the controlled variable voltage.

20. The apparatus of claim 19, wherein the control signal includes a test mode signal or a mode register set signal.

* * * * *